United States Patent
Kim et al.

(10) Patent No.: US 12,004,414 B2
(45) Date of Patent: Jun. 4, 2024

(54) METHOD FOR MANUFACTURING DEVICE

(71) Applicant: LG CHEM, LTD., Seoul (KR)

(72) Inventors: Yongnam Kim, Daejeon (KR); Jong Seok Kim, Daejeon (KR); Yun Hye Hahm, Daejeon (KR); Seiyong Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 501 days.

(21) Appl. No.: 16/972,518

(22) PCT Filed: Sep. 18, 2019

(86) PCT No.: PCT/KR2019/012036
§ 371 (c)(1),
(2) Date: Dec. 4, 2020

(87) PCT Pub. No.: WO2020/060173
PCT Pub. Date: Mar. 26, 2020

(65) Prior Publication Data
US 2021/0273170 A1    Sep. 2, 2021

(30) Foreign Application Priority Data

Sep. 18, 2018  (KR) .................. 10-2018-0111490

(51) Int. Cl.
*H01L 51/00*   (2006.01)
*H01L 31/0224* (2006.01)
(Continued)

(52) U.S. Cl.
CPC ..... *H10K 71/50* (2023.02); *H01L 31/022425* (2013.01); *H01L 31/022466* (2013.01);
(Continued)

(58) Field of Classification Search
CPC ...... H10K 71/50; H10K 30/821; H10K 85/00; H10K 30/82; H10K 71/00; H10K 30/10;
(Continued)

(56) References Cited

U.S. PATENT DOCUMENTS 6,444,899 B2      9/2002  Kubota et al.
10,290,432 B1 *   5/2019  Li .................... H01G 9/2022
(Continued)

FOREIGN PATENT DOCUMENTS

CN    102667960 A    9/2012
CN    104134752 A    11/2014
(Continued)

OTHER PUBLICATIONS

Search Report of European Patent Office in Appl'n No. 19863211.9, dated Jun. 23, 2021.
(Continued)

*Primary Examiner* — Ermias T Woldegeorgis
(74) *Attorney, Agent, or Firm* — Bryan Cave Leighton Paisner LLP (57) ABSTRACT

A method for manufacturing a device, the method including: preparing a first laminate including a first buffer layer and a second buffer layer; preparing a second laminate including a third buffer layer provided on a carbon electrode; and attaching the first laminate to the second laminate so that the second buffer layer is in contact with the third buffer layer.

16 Claims, 2 Drawing Sheets

(51) Int. Cl.
  *H01L 31/18* (2006.01)
  *H10K 30/82* (2023.01)
  *H10K 71/50* (2023.01)
  *H10K 85/00* (2023.01)

(52) U.S. Cl.
  CPC ....... *H01L 31/1884* (2013.01); *H10K 30/821* (2023.02); *H10K 85/00* (2023.02)

(58) Field of Classification Search
  CPC ..... H01L 31/022425; H01L 31/022466; H01L 31/1884; Y02P 70/50; Y02E 10/549
  See application file for complete search history.

(56) References Cited

U.S. PATENT DOCUMENTS

| | | |
|---|---|---|
| 2006/0107997 A1 | 5/2006 | Matsui et al. |
| 2010/0255344 A1 | 10/2010 | Kim et al. |
| 2011/0011451 A1 | 1/2011 | Hakuma et al. |
| 2011/0147719 A1 | 6/2011 | Hsu et al. |
| 2011/0277818 A1 | 11/2011 | Shimura |
| 2015/0249214 A1 | 9/2015 | Watanabe et al. |
| 2016/0196927 A1 | 7/2016 | Bryant et al. |
| 2016/0276612 A1* | 9/2016 | Gotanda ................ H10K 30/83 |
| 2017/0077516 A1 | 3/2017 | Lee et al. |
| 2018/0122584 A1* | 5/2018 | Kim ....................... H10K 71/50 |
| 2018/0358571 A1 | 12/2018 | Choi et al. |
| 2019/0180946 A1 | 6/2019 | Kim et al. |

FOREIGN PATENT DOCUMENTS

| | | | |
|---|---|---|---|
| CN | 104409134 A | 3/2015 | |
| CN | 105161622 A | 12/2015 | |
| CN | 107425143 A | 12/2017 | |
| CN | 107910445 A | 4/2018 | |
| CN | 108320837 A | 7/2018 | |
| CN | 108365108 A | 8/2018 | |
| JP | 2001-185745 A | 7/2001 | |
| JP | 2009-252585 A | 10/2009 | |
| JP | 2009-267056 A | 11/2009 | |
| JP | 2011-238472 A | 11/2011 | |
| JP | 2013222750 A | 10/2013 | |
| JP | 2013222750 A * | 10/2013 | ......... H01L 51/0024 |
| JP | 2015-018664 A | 1/2015 | |
| JP | 2018-006622 A | 1/2018 | |
| JP | 2018-142597 A | 9/2018 | |
| KR | 10-2009-0074998 A | 7/2009 | |
| KR | 10-2010-0111117 A | 10/2010 | |
| KR | 10-1144246 B1 | 5/2012 | |
| KR | 10-2013-0044850 A | 5/2013 | |
| KR | 10-2018-0022734 A | 3/2018 | |
| KR | 10-2018-0033074 A | 4/2018 | |
| KR | 10-1856883 B1 | 5/2018 | |
| KR | 10-2018-0076202 A | 7/2018 | |
| KR | 10-2018-0077404 A | 7/2018 | |
| WO | 2009-110093 A1 | 9/2009 | |

OTHER PUBLICATIONS

Office Action of Japanese Patent Office in Appl'n No. 2020-567582, dated Jul. 5, 2022.

* cited by examiner

METHOD FOR MANUFACTURING DEVICE

CROSS-REFERENCE TO RELATED APPLICATIONS

This is a U.S. national stage of international Application No. PCT/KR2019/012036 filed on Sep. 18, 2019, and claims priority to and the benefit of Korean Patent Application No. 10-2018-0111490 filed in the Korean Intellectual Property Office on Sep. 18, 2018, the entire contents of which are incorporated herein by reference.

TECHNICAL FIELD

The present specification relates to a method for manufacturing a device and a device manufactured thereby.

BACKGROUND

An organic or organic-inorganic hybrid electronic device has drawn attention as a next-generation electronic device due to characteristics such as lightweight, flexibility, and low-temperature process as compared to an inorganic device in the related art. In particular, since a film substrate can be applied to the organic or organic-inorganic hybrid electronic device, a flexible device can be manufactured, and accordingly, there is an advantage in that a roll-to-roll process capable of continuous production can be applied to the device.

However, in the technique in the related art, even though the roll-to-roll process is applied to the organic or organic-inorganic hybrid electronic device, an upper electrode is applied by vacuum deposition in order to secure the performance of the device, and in this case, there is a problem in that it is difficult to achieve mass production because it is difficult to perform vacuum deposition at normal pressure which is used in the roll-to-roll process. Therefore, there is a need for a method for manufacturing an upper electrode, which does not hinder the performance of the device while enabling the process to be performed at normal pressure.

SUMMARY

The present specification provides a method for manufacturing a device, and a device manufactured using the same.

An exemplary embodiment of the present specification provides a method for manufacturing a device, the method including: preparing a first laminate including a first buffer layer and a second buffer layer;
preparing a second laminate including a third buffer layer provided on a carbon electrode; and
attaching the first laminate to the second laminate so that the second buffer layer contacts the third buffer layer.

An exemplary embodiment of the present specification provides a device manufactured by the manufacturing method.

The manufacturing method according to an exemplary embodiment of the present specification can form an electrode by inexpensive coating and lamination processes, and the like because the process can be performed at normal pressure. Accordingly, it is possible to reduce process costs and to secure the performance of an electrode, so that the roll-to-roll continuous process is easily applied.

REFERENCE NUMERALS USED IN THIS APPLICATION

10: First electrode
20: First buffer layer
30: Exciton generation layer
40: Second buffer layer
50: Third buffer layer
60: Second electrode

DETAILED DESCRIPTION

Hereinafter, the present specification will be described in detail.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

An exemplary embodiment of the present specification provides a method for manufacturing a device, the method including: preparing a first laminate including a first buffer layer and a second buffer layer;
preparing a second laminate including a third buffer layer provided on a carbon electrode; and
attaching the first laminate to the second laminate so that the second buffer layer contacts the third buffer layer.

The method for manufacturing a device according to an exemplary embodiment of the present specification reduces the contact resistance at the contact interface between the second buffer layer and the third buffer layer and increasing the charge mobility by preparing each of the first laminate and the second laminate, and attaching the first laminate to the second laminate to manufacture the device, unlike the technology in the related art, in which the respective layers are sequentially stacked and formed.

Further, when devices from a first electrode to an upper carbon electrode are sequentially manufactured, there is a problem because of the contact resistance that occurs at the interface between the carbon electrode and the lower layer due to mesoscopic characteristics of carbon, but the manufacturing method according to an exemplary embodiment of the present specification reduces the pores and contact resistance at the interface between the carbon electrode and the lower layer and current is smoothly injected and extracted by separately manufacturing the second laminate.

In an exemplary embodiment of the present specification, the first laminate includes:
a first electrode;
a first buffer layer provided on the first electrode;
an exciton generation layer provided on the first buffer layer; and
a second buffer layer provided on the exciton generation layer.

In an exemplary embodiment of the present specification, the second laminate includes:

a carbon electrode; and a third buffer layer provided on the carbon electrode.

In an exemplary embodiment of the present specification, the first buffer layer, the second buffer layer, and the third buffer layer are each an electron transport layer or a hole transport layer.

In the present specification, the first buffer layer and the second buffer layer are layers that play different roles. For example, when the first buffer layer is an electron transport layer, the second buffer layer is a hole transport layer. As another example, when the first buffer layer is a hole transport layer, the second buffer layer is an electron transport layer.

In the present specification, the second buffer layer and the third buffer layer are layers that play the same role. For example, when the second buffer layer is an electron transport layer, the third buffer layer is also an electron transport layer. As another example, when the second buffer layer is a hole transport layer, the third buffer layer is also a hole transport layer.

In an exemplary embodiment of the present specification, materials that constitute the second buffer layer and the third buffer layer are the same as or different from each other.

For example, the second buffer layer and the third buffer layer may be composed of the same material. In this case, in the manufactured device, the second buffer layer and the third buffer layer may be formed in the form of a single layer without distinction. That is, when the second buffer layer and the third buffer layer are composed of the same material, a fourth buffer layer (single layer) may be formed in the device.

As another example, the second buffer layer and the third buffer layer may be composed of different materials. In this case, the second buffer layer and the third buffer layer may be each expressed as a first hole transport layer and a second hole transport layer; or a first electron transport layer and a second electron transport layer.

In an exemplary embodiment of the present specification, the first buffer layer is an electron transport layer, and the fourth buffer layer is a hole transport layer.

In an exemplary embodiment of the present specification, the first buffer layer is an electron transport layer, the second buffer layer is a first hole transport layer, and the third buffer layer is a second hole transport layer.

In an exemplary embodiment of the present specification, the first electrode is a lower electrode.

In an exemplary embodiment of the present specification, a carbon electrode is an upper electrode.

In an exemplary embodiment of the present specification, the preparing of the first laminate includes:

preparing a first electrode;

forming a first buffer layer on the first electrode;

forming an exciton generation layer on the first buffer layer;

applying a composition for forming a second buffer layer onto the exciton generation layer; and semi-curing the composition for forming a second buffer layer.

In an exemplary embodiment of the present specification, the forming of the first buffer layer includes applying the composition for forming a first buffer layer onto one surface of the first electrode or coating the one surface of the first electrode with the composition for forming a first buffer layer in the form of a film by using sputtering, E-Beam, thermal deposition, atomic layer deposition (ALD), spin coating, slit coating, screen printing, inkjet printing, spray coating, doctor blade or gravure printing method.

In an exemplary embodiment of the present specification, the first buffer layer may be formed by applying a composition for forming a first buffer layer onto one surface of the first electrode, and then drying the composition on a hot plate.

In an exemplary embodiment of the present specification, the composition for forming a first buffer layer includes an electron transport material or a hole transport material.

In an exemplary embodiment of the present specification, the composition for forming a first buffer layer includes an electron transport material.

In an exemplary embodiment of the present specification, the electron transport material includes one or more selected from the group consisting of a Cu-based inorganic material, a metal oxide, and a fullerene derivative.

In an exemplary embodiment of the present specification, a Cu-based inorganic material applied as the electron transport material is selected from copper (I) thiocyanate (CuSCN), CuI, CuBr, and Cu doped NiO (Cu:NiO).

In an exemplary embodiment of the present specification, a metal oxide applied as the electron transport material is one or more selected from the group consisting of a Ti oxide, a Zn oxide, an In oxide, a Sn oxide, a W oxide, a Nb oxide, a Mo oxide, a Mg oxide, a Zr oxide, a Sr oxide, a Yr oxide, a La oxide, a V oxide, an Al oxide, a Y oxide, a Sc oxide, a Sm oxide, a Ga oxide, a SrTi oxide, and a composite thereof.

In an exemplary embodiment of the present specification, the "fullerene" means a molecule in which a carbon atom is linked in the form of a soccer ball composed of pentagons and hexagons, and is $C_{60}$ to $C_{90}$.

In an exemplary embodiment of the present specification, the "derivative" is a similar compound obtained by chemically changing a part of a compound, and means a compound in which a hydrogen atom or a specific atomic group in a compound is substituted with another atom or atomic group.

In an exemplary embodiment of the present specification, the "fullerene derivative" is a $C_{60}$ to $C_{90}$ fullerene derivative. Specifically, the fullerene derivative may be selected from the group consisting of a $C_{60}$ fullerene derivative, a $C_{61}$ fullerene derivative, a $C_{70}$ fullerene derivative, a $C_{71}$ fullerene derivative, a $C_{76}$ fullerene derivative, a $C_{78}$ fullerene derivative, a $C_{82}$ fullerene derivative, and a $C_{90}$ fullerene derivative. Specifically, the fullerene derivative may be [6,6]-phenyl-$C_{61}$-butyric acid methyl ester ($PC_{61}BM$), [6,6]-phenyl-$C_{71}$-butyric acid methyl ester) ($PC_{71}BM$), phenyl-$C_{61}$-butyric acid cholesteryl ester (PCBCR), or 1'1",4',4"-Tetrahydro-di[1,4]methanonaphthaleno[1,2:2',3',56,60:2",3"][5,6]full erene-$C_{60}$ (ICBA).

In an exemplary embodiment of the present specification, the first buffer layer includes one or more selected from the group consisting of a Cu-based inorganic material, a metal oxide, and a fullerene derivative. In this case, the Cu-based inorganic material, the metal oxide, and the fullerene derivative are the same as those defined for the electron transport material.

In an exemplary embodiment of the present specification, the first buffer layer is provided in a single layer or multiple layers.

In an exemplary embodiment of the present specification, the first buffer layer is provided in one to four layers.

In an exemplary embodiment of the present specification, when the first buffer layer is provided in two or more layers, a material that forms each layer is different from a material that forms an adjacent layer. For example, the first buffer layer may have a four-layer structure provided with a Ti oxide layer/a Zn oxide layer/a Sn oxide layer/PCBM.

In an exemplary embodiment of the present specification, the first buffer layer is formed to have a thickness of 10 nm to 200 nm.

In the present specification, the "exciton" means an electron-hole pair, and an exciton generation layer means a layer that generates an electron-hole pair.

In an exemplary embodiment of the present specification, in the forming of the exciton generation layer, the exciton generation layer may be formed by applying a composition for forming an exciton generation layer onto one surface of a first buffer layer or coating the one surface of the first buffer layer with the composition for forming an exciton generation layer in the form of a film by a method such as spin coating, slit coating, dip coating, inkjet printing, gravure printing, spray coating, doctor blade, bar coating, brush painting, or thermal deposition.

In an exemplary embodiment of the present specification, the exciton generation layer is formed to have a thickness of 30 nm to 2,000 nm.

In an exemplary embodiment of the present specification, the composition for forming an exciton generation layer includes a charge generation material.

In the present specification, the charge generation material means a material that produces electrons and holes upon receiving light energy.

In an exemplary embodiment of the present specification, the composition for forming an exciton generation layer includes a light absorption material.

In an exemplary embodiment of the present specification, the light absorption material includes an organic compound or an organic-inorganic hybrid compound. For example, the light absorption material includes a perovskite compound.

In an exemplary embodiment of the present specification, the composition for forming an exciton generation layer may further include a fluorine-based additive.

In the present specification, the fluorine-based additive means a compound including fluorine in the main chain of the compound.

In an exemplary embodiment of the present specification, the fluorine-based additive includes one or more selected from the group consisting of a fluoro group and a fluoro alkyl group in the main chain of the compound.

In an exemplary embodiment of the present specification, the fluoro alkyl group means that an alkyl group is substituted with at least one fluoro group (F). For example, the fluoro alkyl group may be a perfluoro alkyl group.

In an exemplary embodiment of the present specification, the fluorine-based additive serves as a surfactant in an exciton generation layer. For example, the fluorine-based additive includes a fluorine-based surfactant.

In the present specification, the fluorine-based surfactant means a surfactant including fluorine in the main chain of the surfactant.

In an exemplary embodiment of the present specification, the fluorine-based additive can be used without limitation as long as the additive is a material used in the art. Specifically, the fluorine-based additive may be a compound whose main chain includes a hydrophilic group, a lipophilic group, and a fluoro group; a compound whose main chain includes a hydrophilic group, a lipophilic group, and a fluoro alkyl group; a compound whose main chain includes a hydrophilic group, a lipophilic group, and a perfluoro alkyl group; or a compound whose main chain includes a hydrophilic group, a lipophilic group, a fluoro group, and a perfluoro alkyl group, but is not limited thereto.

In an exemplary embodiment of the present specification, the fluorine-based additive may be represented by the following Formula A:

[Formula A]

In Formula A, x and y are each an integer from 1 to 10.

Specifically, FS-31 manufactured by Dupont Co., Ltd., FS-300 manufactured by Zonyl, RS-72-K manufactured by DIC Corporation, or FC-4430 manufactured by 3M Company may be used as the fluorine-based additive.

In an exemplary embodiment of the present specification, the exciton generation layer includes a fluorine-based additive in an amount of 0.005 wt % to 0.5 wt % based on 100 wt % of an exciton generation layer. Specifically, the exciton generation layer includes the fluorine-based additive in an amount of 0.01 wt % to 0.2 wt % based on 100 wt % of an exciton generation layer.

In an exemplary embodiment of the present specification, the exciton generation layer includes an organic compound or an organic-inorganic hybrid compound; and a fluorine-based additive. Specifically, the exciton generation layer includes an organic-inorganic hybrid compound and a fluorine-based additive.

In an exemplary embodiment of the present specification, the exciton generation layer is a light absorbing layer.

In an exemplary embodiment of the present specification, the forming of the second buffer layer includes applying a composition for forming a second buffer layer onto one surface of an exciton generation layer by using spin coating, slit coating, dip coating, inkjet printing, gravure printing, spray coating, doctor blade, bar coating, brush painting, sputtering, atomic layer deposition (ALD), thermal deposition, or the like.

In an exemplary embodiment of the present specification, the composition for forming a second buffer layer is applied onto the exciton generation layer, and then semi-cured.

In an exemplary embodiment of the present specification, the semi-curing of the composition for forming a second buffer layer includes photo curing or thermally curing the composition for forming a second buffer layer.

In an exemplary embodiment of the present specification, the composition for forming a second buffer layer includes an electron transport material or a hole transport material.

In an exemplary embodiment of the present specification, the composition for forming a second buffer layer includes a hole transport material.

In an exemplary embodiment of the present specification, the hole transport material includes one or more selected from the group consisting of an inorganic material, an organic compound, and a polymer.

In an exemplary embodiment of the present specification, the inorganic material is one or more selected from the group consisting of a Cu-based hole transport material and a metal oxide.

In an exemplary embodiment of the present specification, the Cu-based hole transport material is selected from copper (I) thiocyanate (CuSCN), CuI, CuBr, and Cu doped NiO (Cu:NiO).

In an exemplary embodiment of the present specification, the metal oxide applied as the hole transport material is one or more selected from the group consisting of a Ni oxide, a Cu oxide, a V oxide, a Mo oxide, a Ti oxide, a Sn oxide, and a composite thereof.

In an exemplary embodiment of the present specification, the organic compound is 2,2',7,7'-tetrakis(N,N-di-p-methoxyphenylamine)-9,9'-spirobifluorene (Spiro-OMeTAD).

In an exemplary embodiment of the present specification, the polymer is one or more selected from the group consisting of poly(triaryl amine) (PTAA), poly(3,4-ethylenedioxythiophene)-poly(styrenesulfonate) (PEDOT:PSS), poly[N,N'-bis(4-butylphenyl)-N,N'-bisphenylbenzidine] (PTPD), poly{2,2'-[(2,5-bis(2-hexyldecyl)-3,6-dioxo-2,3,5,6-tetrahydropyrrolo[3,4-c]pyrrole-1,4-diyl)dithiophene]-5,5'-diyl-alt-thiophen-2,5-diyl} (PDPP3T), poly[N-9'-heptadecanyl-2,7-carbazole-alt-5,5-(4',7'-di-2-thienyl-2',1',3'-benzothiadiazole)] (PCDTBT), poly[2,6-(4,4-bis-(2-ethylhexyl)-4H-cyclopenta[2,1-b; 3,4-b']dithiophene)-alt-4,7(2,1,3-benzothiadiazole)] (PCPDTBT), and perylenediimide (PDI).

In an exemplary embodiment of the present specification, the second buffer layer is formed to have a thickness of 10 nm to 300 nm.

In an exemplary embodiment of the present specification, the preparing of the second laminate includes:
preparing a carbon electrode;
applying a composition for forming a third buffer layer onto the carbon electrode; and
semi-curing the composition.

In an exemplary embodiment of the present specification, the carbon electrode is an upper electrode.

In an organic-inorganic hybrid solar cell in the related art, metal was used as an upper electrode. In this case, since metal reacts with halogen elements in a perovskite light absorbing layer, there is a problem in that electrical conductivity and long-term driving stability deteriorate. Further, a vacuum deposition method for introducing metal has a problem in that costs thereof are increased when applied to a roll-to-roll process for commercialization.

In contrast, an exemplary embodiment of the present specification has effects in that the manufacturing process is convenient, the process costs are decreased, and the driving stability of a cell is enhanced by applying a carbon material to an upper electrode. For example, there is an effect in that a cell can be manufactured even at normal pressure.

In an exemplary embodiment of the present specification, the carbon electrode includes one or more of carbon nanotube (CNT), graphite, graphene, graphene oxide, activated carbon, mesoporous carbon, carbon fiber, conductive carbon black, and carbon nano wire.

In an exemplary embodiment of the present specification, the carbon electrode includes two different carbon materials. For example, the carbon electrode includes a first carbon material and a second carbon material which are different from each other, the first carbon material includes one or more of carbon nanotube (CNT), graphite, and graphene, and the second carbon material includes conductive carbon black.

In an exemplary embodiment of the present specification, it is preferred that a conductive carbon material having a small volume and a uniform shape is applied to the carbon material in order to facilitate a physical/chemical contact with a lower layer, and it is preferred that two or more carbon materials are used due to the limitation in conductivity and form.

Among the carbon materials, carbon nanotube (CNT), graphite, and graphene are excellent in conductivity. Therefore, an exemplary embodiment of the present specification includes one or more of carbon nanotube (CNT), graphite, and graphene as a first carbon material.

In addition, among the carbon materials, conductive carbon black has the smallest volume and is close to a 3-dimensional sphere, and thus may serve as a bonding material with a lower layer. Therefore, an exemplary embodiment of the present specification includes conductive carbon black as a second carbon material.

In an exemplary embodiment of the present specification, the carbon electrode further includes a binder.

In an exemplary embodiment of the present specification, as the binder, it is possible to use a poly(meth)acrylic such as polymethylmethacrylate, a polycarbonate-based, a polystyrene-based, a polyarylene-based, a polyurethane-based, a styrene-acrylonitrile-based, a polyvinylidene fluoride-based, a polyvinylidene fluoride-based derivative, ethyl cellulose, and the like, but the binder is not limited thereto.

In an exemplary embodiment of the present specification, the composition for forming a third buffer layer includes an electron transport material or a hole transport material.

In an exemplary embodiment of the present specification, the composition for forming a third buffer layer includes a hole transport material.

In an exemplary embodiment of the present specification, a hole transport material may be included in the composition for forming a third buffer layer as well as the composition for forming a second buffer layer.

In an exemplary embodiment of the present specification, the composition for forming a second buffer layer and the composition for forming a third buffer layer are the same as or different from each other. Specifically, both the composition for forming a second buffer layer and the composition for forming a third buffer layer include a hole transport material, but the types of hole transport materials included in each layer may be different from each other.

In an exemplary embodiment of the present specification, the second buffer layer and the third buffer layer each includes one or more selected from the group consisting of an inorganic material, an organic compound, and a polymer. In this case, the inorganic material, the organic compound, and the polymer are the same as those defined for the hole transport material. In this case, materials included in the second buffer layer and the third buffer layer are the same as or different from each other.

In an exemplary embodiment of the present specification, the forming of the third buffer layer includes applying a composition for forming a third buffer layer onto one surface of a carbon electrode by using spin coating, slit coating, dip coating, inkjet printing, gravure printing, spray coating, doctor blade, bar coating, brush painting, sputtering, or the like.

In an exemplary embodiment of the present specification, the composition for forming a third buffer layer is applied onto the carbon electrode, and then semi-cured.

In an exemplary embodiment of the present specification, the semi-curing of the composition for forming a third buffer layer includes photo curing or thermally curing the composition for forming a third buffer layer.

An exemplary embodiment of the present specification includes attaching a first laminate to a second laminate so that a second buffer layer of the first laminate contacts a third buffer layer of the second laminate.

In an exemplary embodiment of the present specification, the second buffer layer of the first laminate and the third buffer layer of the second laminate are present in a semi-cured state.

In the present specification, the "curing" means a process in which a composition is exposed to heat and/or light, and thus is converted into a final state by chemical or physical action or reaction. For example, the composition may be present in a liquid phase before being cured and converted into a solid phase after being cured.

In an exemplary embodiment of the present specification, the "semi-curing" means that only 20% to 80% of the composition is cured without being completely cured. For example, the composition may be present in a liquid phase before being cured and converted into a state where the composition has viscosity after being semi-cured.

In an exemplary embodiment of the present specification, the semi-curing means that the liquid phase is cured into a state where the liquid phase exhibits a viscosity of 500 cps to 50,000 cps.

In an exemplary embodiment of the present specification, the semi-curing may be performed by thermally curing the composition at 50° C. to 150° C. for 1 minute to 10 minutes.

In an exemplary embodiment of the present specification, the thermal curing may be expressed as being dry.

In an exemplary embodiment of the present specification, the second buffer layer and the third buffer layer are attached to each other in a state where the viscosity is 500 cps to 50,000 cps.

In an exemplary embodiment of the present specification, the first laminate and the second laminate are attached to each other by a lamination method.

In an exemplary embodiment of the present specification, the attaching of the first laminate to the second laminate so that the second buffer layer contacts the third buffer layer includes performing curing during or after the attaching.

In an exemplary embodiment of the present specification, the attaching includes bonding two materials and curing the two materials.

In an exemplary embodiment of the present specification, the method further includes curing the composition at 50° C. to 150° C. for 1 minute to 30 minutes after attaching of the first laminate to the second laminate so that the second buffer layer contacts the third buffer layer.

In an exemplary embodiment of the present specification, the device is selected from the group consisting of an organic-inorganic hybrid solar cell, an organic solar cell, an organic light emitting diode (OLED), and an organic photodiode.

An exemplary embodiment of the present specification provides a device manufactured by the above-described method for manufacturing a device.

In an exemplary embodiment of the present specification, the device includes:
a first electrode;
a first buffer layer provided on the first electrode;
an exciton generation layer provided on the first buffer layer;
a second buffer layer provided on the exciton generation layer;
a third buffer layer provided on the second buffer layer; and
a carbon electrode provided on the third buffer layer.

In an exemplary embodiment of the present specification, the device includes:
a first electrode;
a first buffer layer provided on the first electrode;
an exciton generation layer provided on the first buffer layer;
a fourth buffer layer provided on the exciton generation layer; and
a carbon electrode provided on the fourth buffer layer.

In an exemplary embodiment of the present specification, the fourth buffer layer means that a second buffer layer and a third buffer layer are formed of the same material, and thus is provide in a single layer in a device.

In an exemplary embodiment of the present specification, the device is an organic-inorganic hybrid solar cell.

In an exemplary embodiment of the present specification, the exciton generation layer is a light absorbing layer.

In an exemplary embodiment of the present specification, the light absorbing layer includes a compound having a perovskite structure.

In an exemplary embodiment of the present specification, the compound having a perovskite structure is represented by any one of the following Formulae 1 to 3:

$$R1M1X1_3; \quad \text{[Formula 1]}$$

$$R2_aR3_{(1-a)}M2X2_zX3_{(3-z)}; \quad \text{[Formula 2]}$$

$$R4_bR5_cR6_dM3X4_{z'}X5_{(3-z')}. \quad \text{[Formula 3]}$$

In Formulae 1 to 3,
R2 and R3 are different from each other,
R4, R5, and R6 are different from each other,
R1 to R6 are each independently a monovalent cation selected from $C_nH_{2n+1}NH_3^+$, $NH_4^+$, $HC(NH_2)_2^+$, $Cs^+$, $Rb^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
M1 to M3 are the same as or different from each other, and are each independently a divalent metal ion selected from $Cu^{2+}$, $Ni^{2+}$, $CO^{2+}$, $Fe^{2+}$, $Mn^{2+}$, $Cr^{2+}$, $Pd^{2+}$, $Cd^{2+}$, $Ge^{2+}$, $Sn^{2+}$, $Bi^{2+}$, $Pb^{2+}$, and $Yb^{2+}$,
X1 to X5 are the same as or different from each other, and are each independently a halogen ion,
n is an integer from 1 to 9,
a is a real number of $0<a<1$,
b is a real number of $0<b<1$,
c is a real number of $0<c<1$,
d is a real number of $0<d<1$,
$b+c+d=1$,
z is a real number of $0<z<3$, and
z' is a real number of $0<z'<3$.

In an exemplary embodiment of the present specification, the compound having the perovskite structure in the light absorbing layer may include a single cation. In the present specification, the single cation means that one kind of monovalent cation is used. That is, R1 in Formula 1 means that only one kind of monovalent cation is selected. For example, R1 in Formula 1 is $C_nH_{2n+1}NH_3^+$, and n may be an integer from 1 to 9.

In an exemplary embodiment of the present specification, the compound having the perovskite structure in the light absorbing layer may include a complex cation. In the present specification, the complex cation means that two or more kinds of monovalent cations are used. That is, the complex cation means that R2 and R3 in Formula 2 are different monovalent cations, and R4 to R6 in Formula 3 are different monovalent cations. For example, R2 and R3 in Formula 2 may be $C_nH_{2n+1}NH_3^+$ and $HC(NH_2)_2^+$, respectively. In addition, R4, R5, and R6 in Formula 3 may be $C_nH_{2n+1}NH_3^+$, $HC(NH_2)_2^+$, and $Cs^+$, respectively.

In an exemplary embodiment of the present specification, the compound having the perovskite structure is represented by Formula 1.

In an exemplary embodiment of the present specification, the compound having the perovskite structure is represented by Formula 2.

In an exemplary embodiment of the present specification, the compound having the perovskite structure is represented by Formula 3.

In an exemplary embodiment of the present specification, R1 to R6 are each $C_nH_{2n+1}NH_3^+$, $HC(NH_2)_2^+$, or $Cs^+$. In this case, R2 and R3 are different from each other, and R4 to R6 are different from each other.

In an exemplary embodiment of the present specification, R1 is $CH_3NH_3^+$, $HC(NH_2)_2^+$, or $Cs^+$.

In an exemplary embodiment of the present specification, R2 and R4 are each $CH_3NH_3^+$.

In an exemplary embodiment of the present specification, R3 and R5 are each $HC(NH_2)_2^+$.

In an exemplary embodiment of the present specification, R6 is $Cs^+$.

In an exemplary embodiment of the present specification, M1 to M3 are each Pb $2^+$.

In an exemplary embodiment of the present specification, X2 and X3 are different from each other.

In an exemplary embodiment of the present specification, X4 and X5 are different from each other.

In an exemplary embodiment of the present specification, X1 to X5 are each $F^-$ or $Br^-$.

In an exemplary embodiment of the present specification, a is a real number of 0<a<1, so that the sum of R2 and R3 becomes 1. Furthermore, z is a real number of 0<z<3, so that the sum of X2 and X3 becomes 3.

In an exemplary embodiment of the present specification, b is a real number of 0<b<1, c is a real number of 0<c<1, d is a real number of 0<d<1, and b+c+d=1, so that the sum of R4, R5, and R6 becomes 1. Furthermore, z' is a real number of 0<z'<3, so that the sum of X4 and X5 becomes 3.

In an exemplary embodiment of the present specification, the compound having the perovskite structure is $CH_3NH_3PbI_3$, $HC(NH_2)_2PbI_3$, $CH_3NH_3PbBr_3$, $HC(NH_2)_2PbBr_3$, $(CH_3NH_3)_a(HC(NH_2)_2)_{(1-a)}PbI_zBr_{(3-z)}$, or $(HC(NH_2)_2)_b(CH_3NH_3)_cCs_dPbI_zBr_{(3-z')}$, a is a real number of 0<a<1, b is a real number of 0<b<1, c is a real number of 0<c<1, d is a real number of 0<d<1, b+c+d=1, z is a real number of 0<z<3, and z' is a real number of 0<z'<3.

In an exemplary embodiment of the present specification, the light absorbing layer has a thickness of 30 nm to 200 nm.

When the thickness of the light absorbing layer satisfies the above range, the photoelectric conversion efficiency of the device is enhanced.

In an exemplary embodiment of the present specification, the organic-inorganic hybrid solar cell has an n-i-p structure.

In the present specification, the n-i-p structure means a structure in which a first electrode, a first buffer layer, a light absorbing layer, a second buffer layer, a third buffer layer, and a second electrode are sequentially stacked; or a structure in which a first electrode, a first buffer layer, a light absorbing layer, a fourth buffer layer, and a second electrode are sequentially stacked.

In the n-i-p structure, the first buffer layer may be an electron transport layer, the second buffer layer may be a first hole transport layer, and the third buffer layer may be a second hole transport layer. Further, the first buffer layer may be an electron transport layer, and the fourth buffer layer may be a hole transport layer.

In an exemplary embodiment of the present specification, the organic-inorganic hybrid solar cell may further include a substrate on the lower portion of the first electrode.

In an exemplary embodiment of the present specification, as the substrate, it is possible to use a substrate having excellent transparency, surface smoothness, ease of handling, and waterproofing property. Specifically, a glass substrate, a thin film glass substrate, or a plastic substrate may be used. The plastic substrate may include a flexible film such as polyethylene terephthalate (PET), polyethylene naphthalate (PEN), polyether ether ketone, and polyimide in the form of a single layer or multiple layers. However, the substrate is not limited thereto, and a substrate typically used for an organic-inorganic hybrid solar cell may be used.

In an exemplary embodiment of the present specification, the first electrode may be a transparent electrode, and the solar cell may absorb light by way of the first electrode.

In an exemplary embodiment of the present specification, when the first electrode is a transparent electrode, it is possible to use an electrode as the first electrode in which a material having conductivity is doped on a flexible and transparent material such as plastic including polyethylene terephthalate (PET), polyethylene naphthalate (PEN), polypropylene (PP), polyimide (PI), polycarbonate (PC), polystyrene (PS), polyoxyethylene (POM), an AS resin (acrylonitrile styrene copolymer), an ABS resin (acrylonitrile butadiene styrene copolymer), triacetyl cellulose (TAC), polyarylate (PAR), and the like, in addition to glass and a quartz plate. Specifically, the first electrode may be indium tin oxide (ITO), fluorine doped tin oxide (FTC)), aluminum doped zinc oxide (AZO), indium zinc oxide (IZO), ZnO—$Ga_2O_3$, ZnO—$Al_2O_3$, antimony tin oxide (ATO), and the like, and more specifically, the first electrode may be ITO.

In an exemplary embodiment of the present specification, the first electrode may also be a semi-transparent electrode. When the first electrode is a semi-transparent electrode, the first electrode may be manufactured of a metal such as silver (Ag), gold (Au), magnesium (Mg), or an alloy thereof.

The Examples according to the present specification may be modified in various forms, and it is not interpreted that the scope of the present specification is limited to the Examples described below in detail. The Examples of the present specification are provided to more completely explain the present specification to a person with ordinary skill in the art.

Example 1

An alkali-free glass substrate sputtered with indium tin oxide (ITO) was spin-coated with a solution in which 2 wt % of tin dioxide ($SnO_2$) was included in ethanol at 2,000 rpm, and then dried at 150° C. for 30 minutes. Thereafter, the substrate was spin-coated with a solution in which a perovskite precursor (($HC(NH_2)_2)_x(CH_3NH_3)_yCS_{1-x-y}PbI_zBr_{3-z}$ (0<x<1, 0<y<1, 0.8<x+y<1, 0<z<3)) and 0.05 wt % of a fluorine-based surfactant (manufactured by 3M Company, FC-4430) based on the perovskite precursor were dissolved in dimethylformamide at 5,000 rpm, and then heated at 100° C. for 30 minutes, thereby forming a light absorbing layer. Thereafter, the substrate was bar-coated with a solution in which 1 wt % of PEDOT:PSS was included in anisole by a 10 μm gap, and then dried at 80° C. for 2 minutes, thereby forming a first laminate.

In order to form a second laminate, an alkali-free glass substrate sputtered with indium tin oxide (ITO) was again coated with a carbon electrode as a mixture of graphite, conductive carbon black, and ethyl cellulose (weight ratio 12:5.5:12.5), and heat-treated at 100° C. for 30 minutes. Thereafter, the substrate was bar-coated with a solution in which 1 wt % of PEDOT:PSS was included in anisole by a 10 μm gap, and then dried at 80° C. for 2 minutes, thereby forming a second laminate.

Finally, after the second laminate was turned upside down and laminated on the first laminate, the resulting assembly was heated at 100° C. for 10 minutes, thereby completing an organic-inorganic hybrid solar cell.

Example 2

An alkali-free glass substrate sputtered with indium tin oxide (ITO) was spin-coated with a solution in which 2 wt % of tin dioxide ($SnO_2$) was included in ethanol at 2,000 rpm, and then dried at 150° C. for 30 minutes. Thereafter, the substrate was spin-coated with a solution in which a perovskite precursor (($HC(NH_2)_2)_x(CH_3NH_3)_yCS_{1-x-y}PbI_zBr_{3-z}$ ($0<x<1$, $0<y<1$, $0.8<x+y<1$, $0<z<3$)) and 0.05 wt % of a fluorine-based surfactant (manufactured by 3M Company, FC-4430) based on the perovskite precursor were dissolved in dimethylformamide at 5,000 rpm, and then heated at 100° C. for 30 minutes, thereby forming a light absorbing layer. Thereafter, the substrate was bar-coated with a solution in which 1 wt % of copper(I) thiocyanate (CuSCN) was included in diethylsulfide by a 10 μm gap, and then dried at 80° C. for 2 minutes, thereby forming a first laminate.

In order to form a second laminate, the alkali-free glass substrate sputtered with indium tin oxide (ITO) was again coated with a carbon electrode as a mixture of graphite, conductive carbon black, and ethyl cellulose (weight ratio 12:5.5:12.5), and heat-treated at 100° C. for 30 minutes. Thereafter, the substrate was bar-coated with a solution in which 1 wt % of PEDOT:PSS was included in anisole by a 10 μm gap, and then dried at 80° C. for 2 minutes, thereby forming a second laminate.

Finally, after the second laminate was turned upside down and laminated on the first laminate, the resulting assembly was heated at 100° C. for 10 minutes, thereby completing an organic-inorganic hybrid solar cell.

Comparative Example 1

An alkali-free glass substrate sputtered with indium tin oxide (ITO) was spin-coated with a solution in which 2 wt % of tin dioxide ($SnO_2$) was included in ethanol at 2,000 rpm, and then dried at 150° C. for 30 minutes. Thereafter, the substrate was spin-coated with a solution in which a perovskite precursor (($HC(NH_2)_2)_x(CH_3NH_3)_yCS_{1-x-y}PbI_zBr_{3-z}$ ($0<x<1$, $0<y<1$, $0.8<x+y<1$, $0<z<3$)) and 0.05 wt % of a fluorine-based surfactant (manufactured by 3M Company, FC-4430) based on the perovskite precursor were dissolved in dimethylformamide at 5,000 rpm, and then heated at 100° C. for 30 minutes, thereby forming a light absorbing layer. Thereafter, the substrate was spin-coated with a solution in which 2 wt % of PEDOT:PSS was included in anisole at 3,000 rpm, and then dried at 100° C. for 10 minutes. Finally, the substrate was doctor blade coated with a carbon electrode as a mixture of graphite, conductive carbon black, and ethyl cellulose (weight ratio 12:5.5:12.5), and heated at 100° C. for 30 minutes, thereby completing an organic-inorganic hybrid solar cell.

Comparative Example 2

An alkali-free glass substrate sputtered with indium tin oxide (ITO) was spin-coated with a solution in which 2 wt % of tin dioxide ($SnO_2$) was included in ethanol at 2,000 rpm, and then dried at 150° C. for 30 minutes. Thereafter, the substrate was spin-coated with a solution in which a perovskite precursor (($HC(NH_2)_2)_x(CH_3NH_3)_yCS_{1-x-y}PbI_zBr_{3-z}$ ($0<x<1$, $0<y<1$, $0.8<x+y<1$, $0<z<3$)) and 0.05 wt % of a fluorine-based surfactant (manufactured by 3M Company, FC-4430) based on the perovskite precursor were dissolved in dimethylformamide at 5,000 rpm, and then heated at 100° C. for 30 minutes, thereby forming a light absorbing layer. Thereafter, the substrate was spin-coated with a solution in which 1 wt % of copper(I) thiocyanate was included in diethylsulfide at 3,000 rpm, and then dried at 100° C. for 10 minutes, thereby forming a first laminate. Thereafter, the first laminate was spin-coated with a solution in which 1 wt % of PEDOT:PSS was included in anisole at 3,000 rpm, and then dried at 100° C. for 10 minutes. Finally, the first laminate was doctor blade coated with a carbon electrode as a mixture of graphite, conductive carbon black, and ethyl cellulose (weight ratio 12:5.5:12.5), and heated at 100° C. for 30 minutes, thereby completing an organic-inorganic hybrid solar cell.

Figure 1:
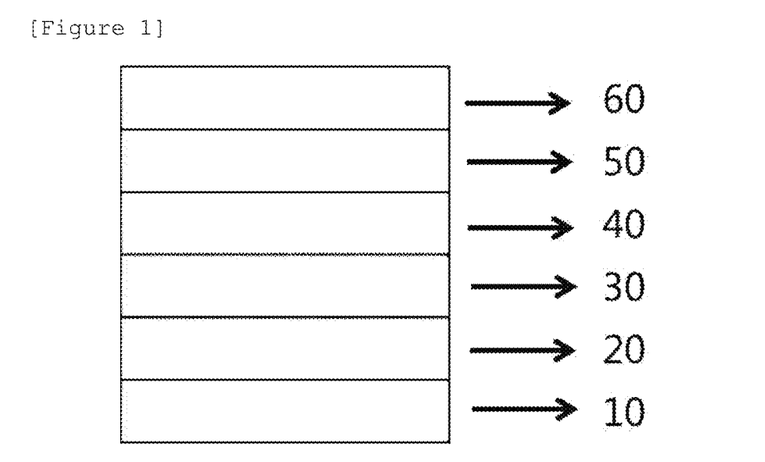
FIG. 1 is a schematic view of a stacking structure of a device manufactured according to exemplary embodiments of the present specification.
Figure 2A:
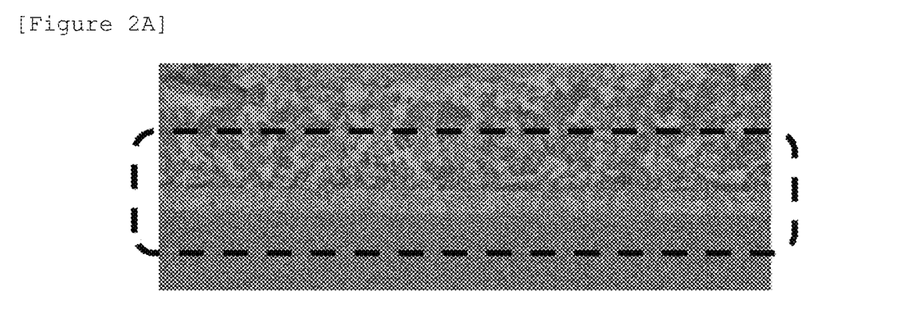
FIGS. 2A and 2B are SEM images of the cross-section of a device manufactured in an exemplary embodiment of the present specification.
Figure 2B:
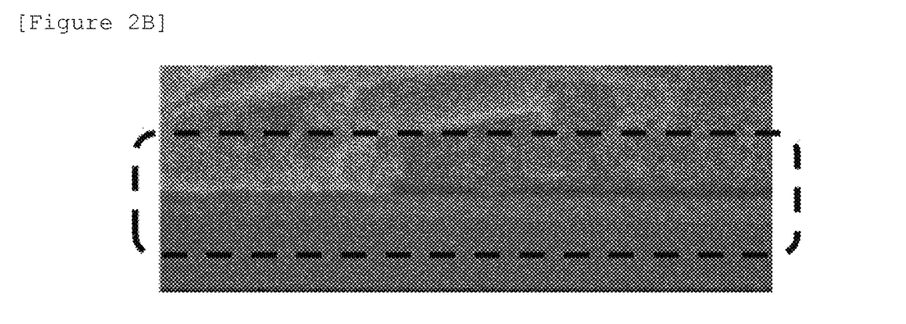

FIGS. 2A and 2B are scanning electron microscope (SEM) (×20K) images of the cross-sections of the devices (organic-inorganic hybrid solar cells) manufactured in Example 1 and Comparative Example 1, respectively.

From the images in FIGS. 2A and 2B, it can be confirmed that there are no pores between the carbon electrode and the lower layer in the device manufactured in Example 1, whereas there are pores between the carbon electrode and the lower layer in the device manufactured in Comparative Example 1.

Through this, it can be confirmed that when a second laminate is separately prepared as in an exemplary embodiment of the present specification, a device is manufactured without defects or pores between the respective layers.

For the organic-inorganic hybrid solar cells manufactured in Examples 1 and 2 and Comparative Examples 1 and 2, the performance of the device was measured by using ABET Sun 3000 solar simulator as a light source, and a Keithley 2420 source meter.

Figure 3:
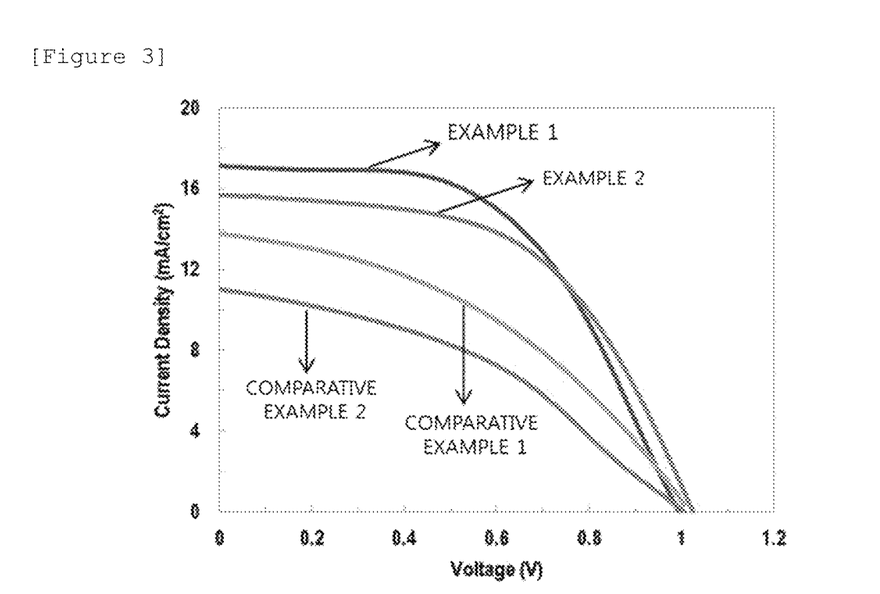
FIG. 3 is a graphical representation of the performance results of a device manufactured in an exemplary embodiment of the present specification.

Table 1 lists the device measurement results of the organic-inorganic hybrid solar cells manufactured in Examples 1 and 2 and Comparative Examples 1 and 2. FIG. 3 is a graphical representation of the results in Table 1.

TABLE 1

|  | PCE (%) | $J_{SC}$ (mA/cm$^2$) | $V_{oc}$ (V) | FF |
|---|---|---|---|---|
| Example 1 | 9.2 | 17.2 | 1.00 | 53.2 |
| Example 2 | 8.7 | 15.7 | 1.02 | 54.3 |
| Comparative Example 1 | 5.7 | 13.8 | 1.01 | 41 |
| Comparative Example 2 | 4.3 | 11.0 | 1.00 | 39.4 |

In Table 1, $V_{oc}$, $J_{sc}$, FF, and PCE mean an open-circuit voltage, a short-circuit current density, a fill factor, and energy conversion efficiency, respectively. The open-circuit voltage and the short-circuit current density are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current density and the open-circuit voltage. The energy conversion efficiency may be obtained when these three values are divided by the intensity of the irradiated light, and the higher value is preferred.

From Table 1, it can be confirmed that Examples 1 and 2 and Comparative Examples 1 and 2 are similar in the open-circuit voltage ($V_{oc}$), but the short-circuit current density ($J_{sc}$), the fill factor (FF), and the efficiency (PCE) in Examples 1 and 2 are improved more than the short-circuit current density ($J_{sc}$), the fill factor (FF), and the efficiency (PCE) in Comparative Examples 1 and 2.

The invention claimed is:

1. A method for manufacturing a device, the method comprising:
   preparing a first laminate comprising a first buffer layer and a second buffer layer;
   preparing a second laminate comprising a third buffer layer provided on a carbon electrode; and
   attaching the first laminate to the second laminate so that the second buffer layer is in contact with the third buffer layer,
   wherein the carbon electrode comprises a first carbon material and a second carbon material which are different from each other, and
   wherein when attaching the first laminate to the second laminate, both the second buffer layer and the third buffer layer are in a semi-cured state.

2. The method of claim 1, wherein the first laminate further comprises a first electrode and an exciton generation layer, and preparing the first laminate comprises:
   providing the first buffer layer on the first electrode;
   providing the exciton generation layer on the first buffer layer; and
   providing the second buffer layer on the exciton generation layer.

3. The method of claim 2, wherein the exciton generation layer is a light absorbing layer.

4. The method of claim 3, wherein the light absorbing layer comprises a compound having a perovskite structure.

5. The method of claim 1, wherein the preparing of the second laminate comprises:
   preparing the carbon electrode;
   applying a composition for forming the third buffer layer onto the carbon electrode; and
   semi-curing the composition to form the third buffer layer.

6. The method of claim 5, wherein the semi-curing of the composition for forming a third buffer layer comprises photo curing or thermally curing the composition.

7. The method of claim 1, wherein the first and second carbon materials are independently one or more selected from the group consisting of carbon nanotube (CNT), graphite, graphene, graphene oxide, activated carbon, mesoporous carbon, carbon fiber, conductive carbon black, and carbon nano wire.

8. The method of claim 7, wherein the carbon electrode further comprises a binder.

9. A device manufactured by the manufacturing method according to claim 1.

10. The device of claim 9, wherein the device comprises:
    a first electrode;
    the first buffer layer provided on the first electrode;
    an exciton generation layer provided on the first buffer layer;
    the second buffer layer provided on the exciton generation layer;
    the third buffer layer provided on the second buffer layer; and
    the carbon electrode provided on the third buffer layer.

11. The device of claim 9, wherein the device comprises:
    a first electrode;
    the first buffer layer provided on the first electrode;
    an exciton generation layer provided on the first buffer layer;
    a fourth buffer layer provided on the exciton generation layer; and
    the carbon electrode provided on the fourth buffer layer.

12. The method of claim 1, wherein the attaching of the first laminate to the second laminate further comprises performing curing during or after the attaching of the first laminate to the second laminate.

13. The method of claim 1, wherein the first buffer layer is composed of a single layer or multiple layers.

14. The method of claim 1, wherein the device is selected from the group consisting of an organic-inorganic hybrid solar cell, an organic solar cell, an organic light emitting diode (OLED), and an organic photodiode.

15. The method of claim 1, wherein the first buffer layer comprises one or more selected from the group consisting of a Cu-based inorganic material, a metal oxide, and a fullerene derivative.

16. The method of claim 1, wherein the second buffer layer and the third buffer layer each comprises one or more selected from the group consisting of an inorganic material, an organic compound, and a polymer.

\* \* \* \* \*